(12) United States Patent
Frank et al.

(10) Patent No.: US 10,651,723 B1
(45) Date of Patent: May 12, 2020

(54) METHOD FOR STATIC GATE CLAMPING IN MULTI-OUTPUT GATE DRIVER SYSTEMS

(71) Applicant: Infineon Technologies Austria AG, Villach (AT)

(72) Inventors: Wolfgang Frank, Augsburg (DE); Simone Fabbro, Udine (IT); Karl Norling, Villach (AT)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 0 days.

(21) Appl. No.: 16/166,953

(22) Filed: Oct. 22, 2018

(51) Int. Cl.
*H03K 17/687* (2006.01)
*H02M 1/096* (2006.01)
*H03K 19/00* (2006.01)
*H03K 19/17772* (2020.01)

(52) U.S. Cl.
CPC .......... *H02M 1/096* (2013.01); *H03K 17/687* (2013.01); *H03K 19/0016* (2013.01); *H03K 19/17772* (2013.01)

(58) Field of Classification Search
CPC ............. H03K 17/687; H03K 19/0016; H03K 19/17772
USPC .... 327/108–112, 427, 434, 437; 326/82, 83, 326/87
See application file for complete search history.

(56) References Cited

U.S. PATENT DOCUMENTS

| | | | | |
|---|---|---|---|---|
| 6,271,709 | B1 * | 8/2001 | Kimura | H03K 17/168 327/170 |
| 6,333,665 | B1 * | 12/2001 | Ichikawa | H03K 17/168 327/389 |
| 2015/0171852 | A1 | 6/2015 | Pang | |
| 2015/0318850 | A1 | 11/2015 | Hiyama | |
| 2017/0288653 | A1 | 10/2017 | Yokoi et al. | |

* cited by examiner

*Primary Examiner* — Tomi Skibinski
(74) *Attorney, Agent, or Firm* — Slater Matsil, LLP

(57) ABSTRACT

A multi-output gate driver system comprises a power device having a gate node; a first driver having an input and an output coupled to the gate node; a second driver having an input and an output coupled to the gate node; a first comparator having a first input coupled to the output of the second driver, a second input coupled to a first reference voltage, and an output; a second comparator having a first input coupled to the output of the second driver, a second input coupled to a second reference voltage, and an output; and a logic circuit having an input for receiving a control signal, a first output coupled to the input of the first driver, and a second output coupled to the input of the second driver.

20 Claims, 17 Drawing Sheets

FIG 1B

| State | IN | INF | Improved standard | | | |
|---|---|---|---|---|---|---|
| | | | OUT1 | OUT2 | OUT1 | OUT2 |
| 1 | 0 | 0 | 0 | 0* | OFF | OFF |
| 2 | 0->1 | 0 | 0->1 | 0->HiZ | ON Rg1 | HiZ |
| 3 | 0 | 0->1 | 0 | 0* | OFF | OFF |
| 4 | 1 | 0 | 1 | 1* | ON | ON |
| 5 | 1->0 | 0 | 1->0 | 1->0 | OFF Rg1\|\|Rg2 | OFF Rg1\|\|Rg2 |
| 6 | 1 | 0->1 | 1 | 1* | ON | ON |
| 7 | 0 | 1 | 0 | 0* | OFF | OFF |
| 8 | 0 | 1->0 | 0 | 0* | OFF | OFF |
| 9 | 0->1 | 1 | 0->1 | 0->1 | ON Rg1\|\|Rg2 | ON Rg1\|\|Rg2 |
| 10 | 1 | 1 | 1 | 1* | ON | ON |
| 11 | 1 | 1->0 | 1 | 1* | ON | ON |
| 12 | 1->0 | 1 | 1->0 | 1->HiZ | OFF Rg1 | HiZ |

FIG 2B

| State | IN | INF | OUT2 only clamps | | OUT1 | OUT2 |
|---|---|---|---|---|---|---|
| | | | OUT1 | OUT2 | | |
| 1 | 0 | 0 | 0 | 0* | OFF | OFF |
| 2 | 0->1 | 0 | 0->1 | 0->HiZ | ON Rg1 | HiZ |
| 3 | 0 | 0->1 | 0 | 0* | OFF | OFF |
| 4 | 1 | 0 | 1 | 1* | ON | ON |
| 5 | 1->0 | 0 | 1->0 | 1->HiZ | OFF Rg1 | HiZ |
| 6 | 1 | 0->1 | 1 | 1* | ON | ON |
| 7 | 0 | 1 | 0 | 0* | OFF | OFF |
| 8 | 0 | 1->0 | 0 | 0* | OFF | OFF |
| 9 | 0->1 | 1 | 0->1 | 0->HiZ | ON Rg1 | HiZ |
| 10 | 1 | 1 | 1 | 1* | ON | ON |
| 11 | 1 | 1->0 | 1 | 1* | ON | ON |
| 12 | 1->0 | 1 | 1->0 | 1->HiZ | OFF Rg1 | HiZ |

FIG. 3B

| State | IN | INF | OUT1 | OUTF | OUT1 | OUT2 |
|---|---|---|---|---|---|---|
| | | | OUT2 active turn-on and for off clamp only; | | | |
| 1 | 0 | 0 | 0 | 0* | OFF | OFF |
| 2 | 0->1 | 0 | 0->1 | 0->HiZ | ON Rg1 | HiZ |
| 3 | 0 | 0->1 | 0 | 0* | OFF | OFF |
| 4 | 1 | 0 | 1 | 1* | ON | ON |
| 5 | 1->0 | 0 | 1->0 | 1->HiZ | OFF Rg1 | HiZ |
| 6 | 1 | 0->1 | 1 | 1* | ON | ON |
| 7 | 0 | 1 | 0 | 0* | OFF | OFF |
| 8 | 0 | 1->0 | 0 | 0* | OFF | OFF |
| 9 | 0->1 | 1 | 0->1 | 0->1 | ON Rg1\|\|Rg2 | ON Rg1\|\|Rg2 |
| 10 | 1 | 1 | 1 | 1* | ON | ON |
| 11 | 1 | 1->0 | 1 | 1* | ON | ON |
| 12 | 1->0 | 1 | 1->0 | 1->HiZ | OFF Rg1 | HiZ |

FIG. 9

| State | IN | INF | Improved standard | | | |
|---|---|---|---|---|---|---|
| | | | OUT1 | OUT2 | OUT1 | OUT2 |
| 1 | 0 | 0 | 0 | 0* | OFF | OFF |
| 2 | 0->1 | 0 | 0->1 | 0->HiZ | ON Rg | HiZ |
| 3 | 0 | 0->1 | 0 | 0* | OFF | OFF |
| 4 | 1 | 0 | 1 | 1* | ON | ON |
| 5 | 1->0 | 0 | 1->0 | 1->0 | OFF Rg\|\|Rgf | OFF Rg\|\|Rgf |
| 6 | 1 | 0->1 | 1 | 1* | ON | ON |
| 7 | 0 | 1 | 0 | 0* | OFF | OFF |
| 8 | 0 | 1->0 | 0 | 0* | OFF | OFF |
| 9 | 0->1 | 1 | 0->1 | 0->1 | ON Rg\|\|Rgf | ON Rg\|\|Rgf |
| 10 | 1 | 1 | 1 | 1* | ON | ON |
| 11 | 1 | 1->0 | 1 | 1* | ON | ON |
| 12 | 1->0 | 1 | 1->0 | 1->HiZ | OFF Rg | HiZ |

METHOD FOR STATIC GATE CLAMPING IN MULTI-OUTPUT GATE DRIVER SYSTEMS

TECHNICAL FIELD

The present invention relates generally to a system and method for static gate clamping in multi-output gate driver systems.

BACKGROUND

A gate driver is a power amplifier and may also include additional circuitry, such as a level shifter. The gate driver accepts a low-power input signal from an associated controller IC and produces a high-current drive input signal for the gate of a high-power transistor such as an Insulated Gate Bipolar Transistor ("IGBT") or a power Metal-Oxide-Semiconductor Field-Effect Transistor ("MOSFET"). Typically a single output of the gate driver is used to drive a single gate node of a power transistor. Two outputs can sometimes be used to drive a high-side power transistor and a low-side power transistor. The gate driver can have one or more dedicated outputs for providing a clamping function.

SUMMARY

A multi-output gate driver system comprises a power device having a gate node; a first driver having an input and an output coupled to the gate node; a second driver having an input and an output coupled to the gate node; a first comparator having a first input coupled to the output of the second driver, a second input coupled to a first reference voltage, and an output; a second comparator having a first input coupled to the output of the second driver, a second input coupled to a second reference voltage, and an output; and a logic circuit having an input for receiving a control signal, a first output coupled to the input of the first driver, and a second output coupled to the input of the second driver.

BRIEF DESCRIPTION OF THE DRAWINGS

For a more complete understanding of the present invention, and the advantages thereof, reference is now made to the following descriptions taken in conjunction with the accompanying drawings, in which:

FIG. 1B is a logic table associated with the multi-output gate driver system of FIG. 1A;

FIG. 3B is a logic table associated with the multi-output gate driver system of FIG. 3A;

FIG. 9 is a logic table associated with the multi-output gate driver system of FIG. 6;

DETAILED DESCRIPTION OF ILLUSTRATIVE EMBODIMENTS

According to embodiments, a gate driver can have two or more independently or dependently controllable outputs, which both apply the gate voltage to a driven power transistor in a mode of operation. Each of the outputs can have a gate resistor used independently for turn-on and turn-off. The individual outputs can be activated depending on a dedicated load condition or temperature condition or other operating conditions. The more outputs that are activated (switching in parallel), the faster the driven power transistor (sometimes referred to as a "switch" or "device") can be switched. Consequently, the switching speed of corresponding converters or inverters including the gate driver and the switch can also be increased. A better tradeoff between switching losses and EMI or safe operating area can also be achieved.

In a two-output gate driver, when operating only one of the two outputs, the other output can be kept in a high impedance state. However, the high impedance operation of the second output has two disadvantages with respect to the power transistor:

1. The power transistor is more sensitive to parasitic turn-on during dv/dt events in the OFF-state.
2. High side clamping strength in the ON state is relatively weak.

Thus, according to embodiments of a multi-output gate driver system, the second output supports both OFF-state clamping to a negative gate voltage as well as ON-state clamping to a positive gate voltage. Clamping refers to activation of the related driver stage, circuitry, or output FET(s). Clamping High refers to activating the sourcing stage of the related driver. Clamping Low refers to activating the sinking stage of the related driver.

The multi-output gate driver system copies the state of the first output to the second output as soon as the gate voltage of the first output has reached a level, where the switching transient of the driven transistor current and voltage has passed. This function can be implemented for example by voltage comparators, described in further detail below, which monitor the instantaneous gate voltage. If the gate voltage of the power transistor is lower than the gate-emitter or gate-source threshold of a power transistor, the gate can be clamped to the negative gate voltage. Similarly, the gate can be clamped to the positive rail voltage, if the gate voltage is close to the positive rail. However, the second output is inactive during every change of gate voltage.

Figure 1A:
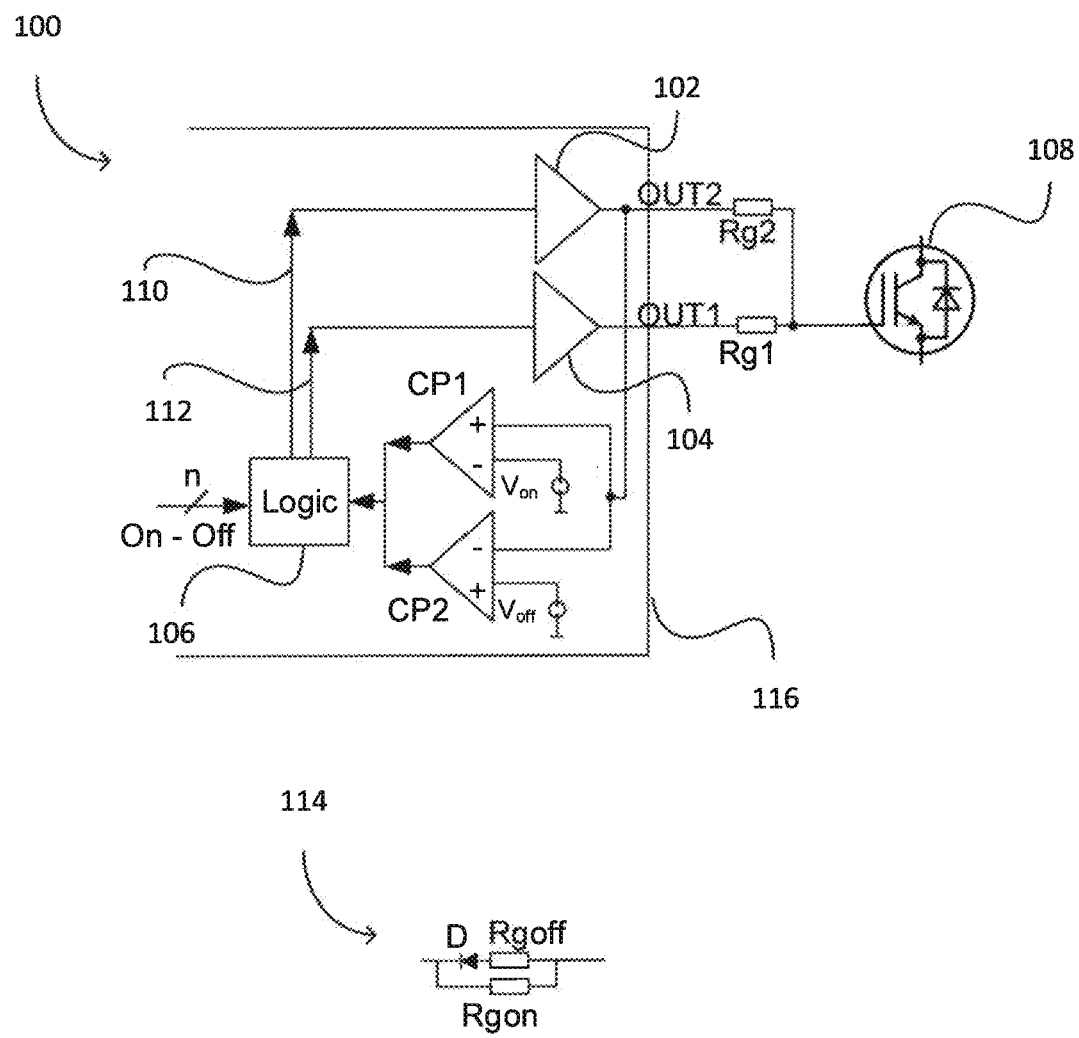
FIG. 1A is a schematic diagram of an embodiment of a multi-output gate driver system, including voltage comparators associated with ON-state and OFF-state operating conditions as well as a schematic diagram of an alternative configuration for the gate resistors used in the gate driver system.

FIG. 1A shows a schematic diagram of a multi-output gate driver system 100 comprising a power device 108 having a gate node; a first driver 104 having an input and an output OUT1 coupled to the gate node; a second driver 102 having an input and an output OUT2 coupled to the gate node; a first comparator CP1 having a positive input coupled to the output of the second driver 102, a negative input coupled to a first reference voltage $V_{ON}$, and an output; a second comparator CP2 having a negative input coupled to the output of the second driver 102, a positive input coupled to a second reference voltage $V_{OFF}$, and an output; and a logic circuit 106 having a first input for receiving a control signal for switching the power device on and off, a second input coupled to the outputs of the first and second comparators CP1 and CP2, a first output 112 coupled to the input of the first driver 104, and a second output no coupled to the input of the second driver 102. In FIG. 1A the logic circuit 106 may be implemented as hardware or software. At least two input signals are received by logic circuit 106: an on/off signal for changing the state of power device 108, and a signal associated with the outputs of comparators CP1 and CP2. Depending upon the logic function used by logic circuit 106, an input bus that is "n" bits wide depending, for example, on the number of outputs used, can be implemented. For example, in the embodiment of FIG. 1A an input bus two bits wide can be used corresponding to two different input signals. The operation of the logic circuit 106 and the entire multi-output gate driver system 100 is described in further detail below.

The gate driver circuit 116 including gate drivers 102 and 104, comparators CP1 and CP2, and logic circuit 106 can be implemented as a single integrated circuit including other circuitry such as a microprocessor as well as other circuitry in an embodiment. In other embodiments, discrete components or a plurality of integrated circuits, or a combination thereof, can also be used.

Figure 14:
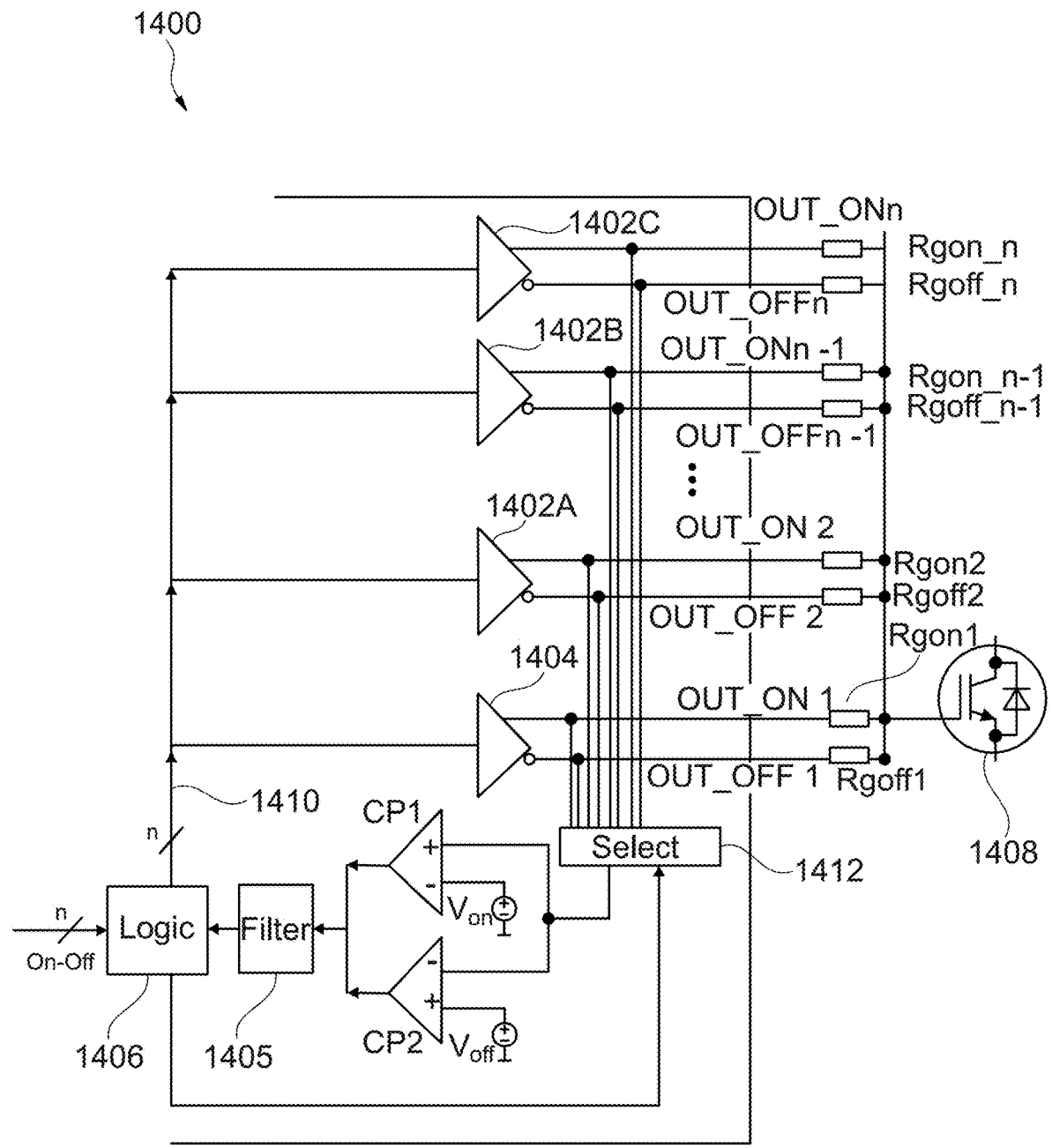
FIG. 14 is a schematic diagram of a multi-output gate driver system in which more than two drivers are shown, wherein each driver has a separate sink and source output.

In FIG. 1A, two gate resistors Rg1 and Rg2, are used. Gate resistor Rg1 is coupled between the output of driver 104 and the gate node of power device 108. Gate resistor Rg2 is coupled between the output of driver 102 and the gate node of power device 108. Single resistor elements have the same or different values can be used for gate resistors Rg1 and Rg2. However, an alternative parallel resistor circuit 114 can also be used to accommodate various operating modes. Parallel resistor circuit 114 shows a first resistor $Rg_{OFF}$ in series combination with a diode D. The first resistor and diode are in parallel with a second resistor $Rg_{ON}$. The first and second resistors in parallel resistor circuit 114 can have different values in an embodiment. In this case, the parallel resistor circuit 114 will have different values when sinking or sourcing current from the gate of power device 108. The diode D may be omitted if an embodiment is used having a separate terminal for sourcing current (connected to resistor $Rg_{ON}$) and a separate terminal for sinking current (connected to resistor $Rg_{OFF}$). Such an embodiment is shown in FIG. 14.

Filters at the input and/or output of each comparator CP1 and CP2 are optional. A suitable filter placement is shown, for example, in FIGS. 13 and 14, described in further detail below.

In operation, according to a control setting, the second output OUT2 is used as a sense input for the gate voltage. This is possible during a suitable time interval after a transition of OUT1 where OUT2 is kept deactivated (in high impedance). In the case of a turn-off transient, OUT2 is activated as soon as the gate voltage is below the comparator threshold of CP2 ($V_{OFF}$). In case of a turn-on threshold, OUT2 is activated as soon as the gate voltage is above the threshold of CP1 ($V_{ON}$). If the control is changed to switch both outputs (OUT1 and OUT2) together in order to get an overall lower gate resistance the monitoring comparators are in principle not needed for the case of two driver stages. An alternative embodiment without the two comparators CP1 and CP2 is explained in further detail below. In this embodiment, the sensing can still be done on the second output OUT2. If more than two driver stages are used in parallel the sensing should be done on the output that is the last to actively switch together with the other outputs (not shown in FIG. 1A). Alternatively, a separate sense pin could also be used.

Resistor and voltage ranges for the multi-output gate driver system 100 shown in FIG. 1A can be varied to accommodate specific applications.

FIG. 1B is a corresponding logic table for the circuit embodiment of FIG. 1A, including twelve logic states, wherein the individual IN, INF, OUT1, and OUT2 logic states are specified. Additionally, the output impedance and operational state for the circuit embodiment of FIG. 1A is also shown.

With respect to FIGS. 1B, 2B, and 3B an asterisk in the logic table refers to an optional logic state, and the output OUT2 can be left in a HiZ (high impedance state) instead.

With respect to the clamping function, the OUT2 output does not reach the ON or OFF state until the OUT2 voltage has reached a level close to that of the OUT1 voltage.

FIG. 2A is a schematic diagram of another embodiment of a multi-output gate driver system 200 using the second output OUT2 as a gate clamp only. In gate driver system 200 the second output OUT2 is activated only if the first output OUT1 has reached its steady state, which is either the ON or OFF state. A second gate resistor is therefore not required in gate driver system 200. Otherwise, all of the numbered components shown in FIG. 2A have been previously described.

FIG. 2B is a corresponding logic table for the circuit embodiment of FIG. 2A, including twelve logic states, wherein the individual IN, INF, OUT1, and OUT2 logic states are specified. Additionally, the output impedance and operational state for the circuit embodiment of FIG. 2A is also shown.

Figure 3A:
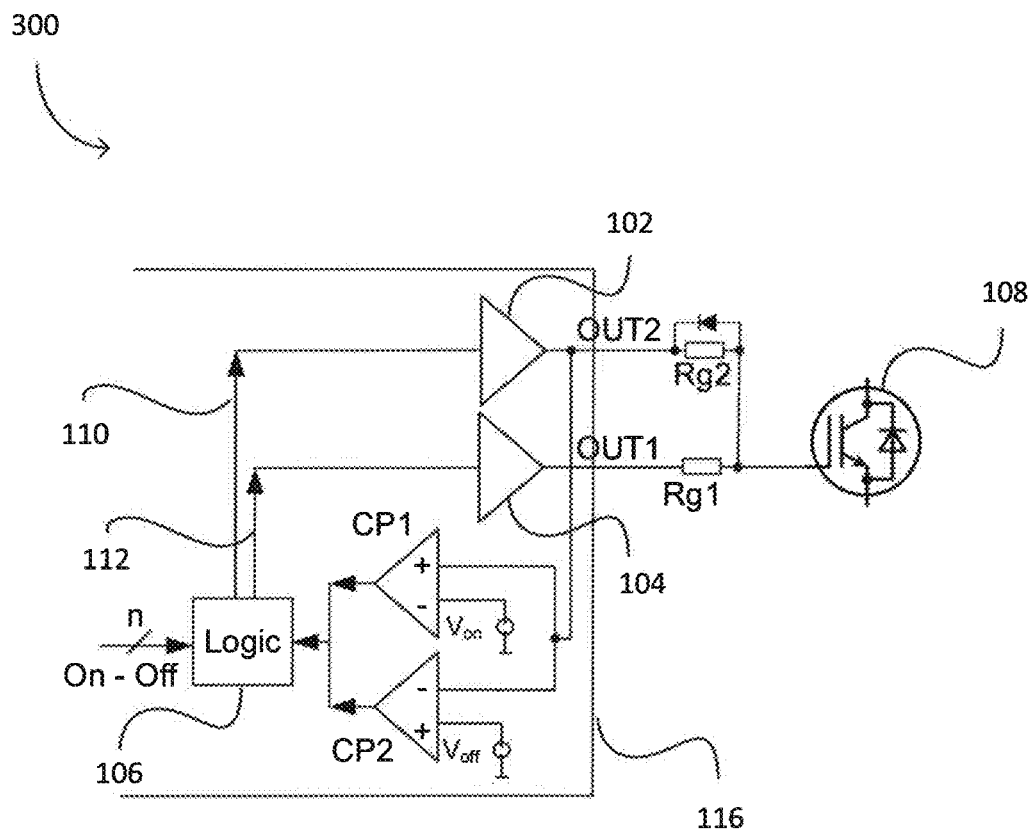
FIG. 3A is a schematic diagram of another embodiment of a multi-output gate driver system, with the second output used for sourcing and clamping during the OFF-state.

FIG. 3A is a schematic diagram of another embodiment of a multi-output gate driver system 300, where the second output OUT2 is able to source gate current through resistor Rg2 in parallel to OUT1. Additionally, the second output OUT2 can be used as an active Miller clamp pin during the OFF-state. Of course, the active Miller clamp performance may be reduced by the optional diode, which is in parallel to Rg2. A diode is shown in parallel with resistor Rg2 in gate driver system 300. Otherwise all of the numbered components shown in FIG. 3A have been previously described.

FIG. 3B is a corresponding logic table for the circuit embodiment of FIG. 3A, including twelve logic states, wherein the individual IN, INF, OUT1, and OUT2 logic states are specified. Additionally, the output impedance and operational state for the circuit embodiment of FIG. 3A is also shown (as well as the related control settings).

Figure 4:
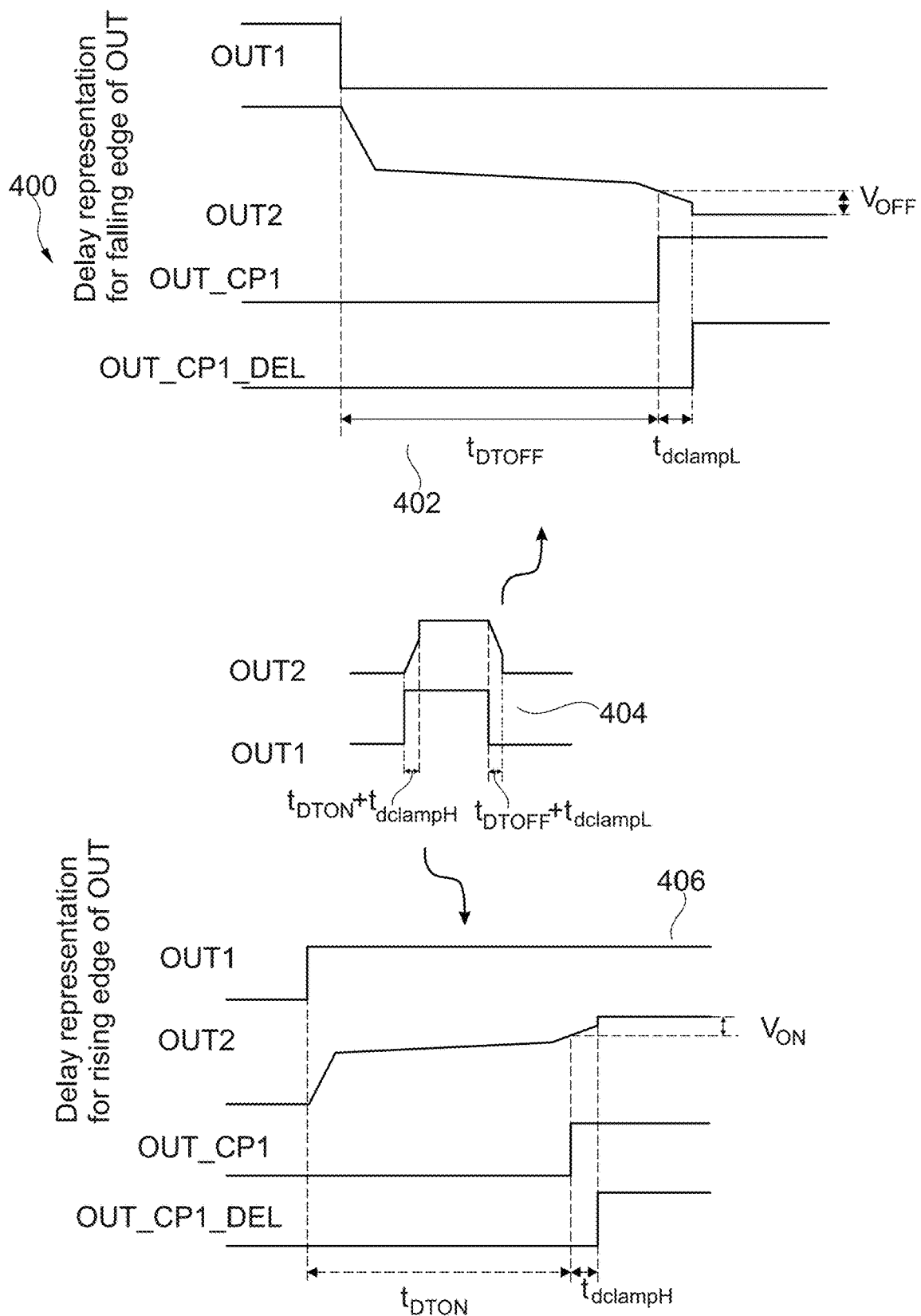
FIG. 4 is a timing diagram associated with the multi-output gate driver systems shown in FIGS. 1-3.

The embodiments of FIGS. 1A-3A using two comparators monitoring the gate voltage can lead to the possible timing diagram 400 shown in FIG. 4, where an overall timing diagram 404 as well as zoomed timing diagrams 402 and 406 show further operational details of the comparators as well as optional safety time delays. After either one or the other comparator detects that the gate voltage reached the respective threshold voltage (which may take a time period $t_{TDON}$ or $t_{TDOFF}$) a safety delay $t_{dclampH}$ or $t_{dclampL}$ expires before the decision of either comparators is transmitted to the logic determining the activation of the second output OUT2.

Timing diagram 404 shows an entire switching sequence in which both outputs (OUT1 and OUT2) are in the OFF state, only the first output OUT1 is in the ON state, both outputs (OUT1 and OUT2) are in the ON state, only the first output OUT1 is in the OFF state, and then both outputs (OUT1 and OUT2) are again in the OFF state. The example timing diagram 404 assumes that the control setting determined this sequence. The control settings determine for which transition of OUT1 and OUT2 has to work, according to the comparators' decision, or independent of it.

Timing diagram 406 shows further details of the turn-on sequence including the OUT1 and OUT2 waveforms, as well as the output signals from comparator CP1 (OUT_CP1 and the optional delayed OUT_CP1_DEL). The differential voltage $V_{ON}$ represents the difference between the final gate voltage during ON state and the trigger threshold of comparator CP1.

Timing diagram 402 shows further details of the turn-off sequence including the OUT1 and OUT2 waveforms, as well as the output signals from comparator CP1 (OUT_CP1 and the optional delayed OUT_CP1_DEL). The differential voltage $V_{OFF}$ represents the difference between the final gate voltage during OFF state and the trigger threshold of comparator CP2. Alternatively, it can represent the difference between ground (zero volts) and the trigger threshold of comparator CP2.

Depending on system related conditions, the second output OUT2 may either be switched according to OUT1 depending on the comparators and on the optional additional delays, or can be switched concurrently with OUT1, leading thereby to timing diagrams different than the example timing diagrams 400 shown in FIG. 4.

Figure 2:
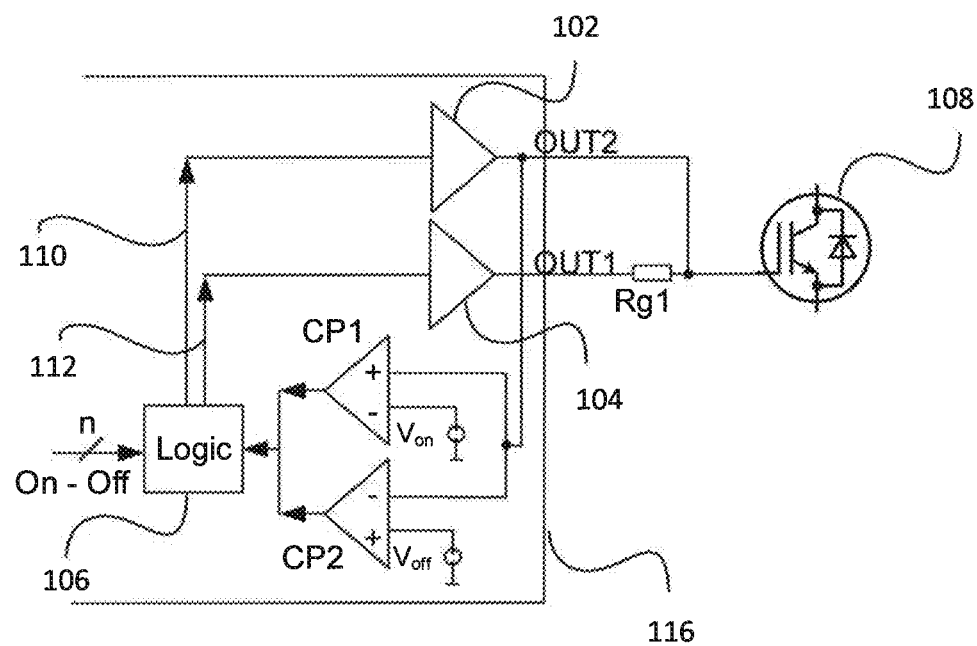
FIG. 2A is a schematic diagram of another embodiment of a multi-output gate driver system, with the second output used for clamping only.
FIG. 2B is a logic table associated with the multi-output gate driver system of FIG. 2A.

In summary, the multi-output gate driver system embodiments shown in FIGS. 1-3 provide an improved OFF-state and ON-state clamping of the power device gate voltage. This, in turn, supports a tighter gate control and less sensitivity to parasitic effects. Thus, all inactive outputs (one in the two-output embodiment, or more for a multiple-output embodiment) can be used for gate clamping to the positive rail (ON-state) or negative rail (OFF-state).

Figure 5:
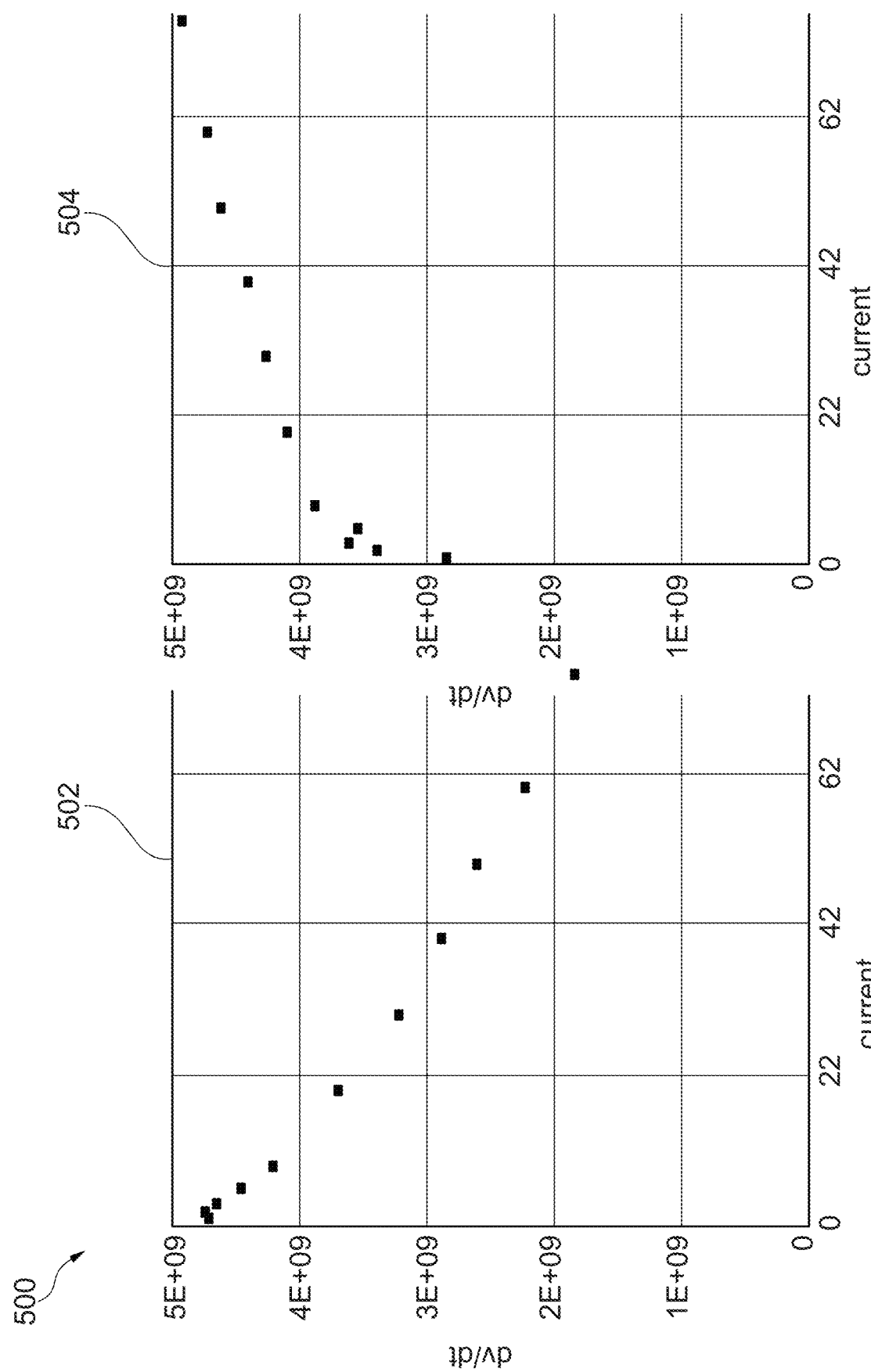
FIG. 5 is a diagram of the change in collector voltage versus time ("dv/dt") for a power device as a function of the collector current for turn-on and turn-off operating conditions for a specified value of gate resistance of the power device.

With a given resistance Rg driving the gate, the rate of change of drain/collector voltage of power transistors, particularly IGBTs, exhibit an opposite behavior for an increasing collector current, depending on whether the power transistor is turned on or off. While at turn-on the drain/collector dv/dt decreases with a higher collector current, at turn-off the drain/collector dv/dt increases with a higher collector current as is shown in FIG. 5, and is described in further detail below. For example, the diagram 500 shows the dv/dt of the collector voltage during a turn-on mode 502, and the dv/dt of the collector voltage during a turn-off mode 504. Note that the dv/dt exhibits in both modes of operation areas of high dv/dt mode of operation, and areas of low dv/dt mode of operation.

This switching behavior can result in excessively high drain/collector dv/dt values in applications, especially in drive systems where the maximum allowed drain/collector dv/dt is specified. According to an embodiment, gate drive circuits are used that have two independent outputs and both outputs are operated in parallel at high collector current as is shown in FIG. 6, and is described in further detail below, whereas at light load only one driver output is used while the other is kept in tristate.

To achieve a more constant drain/collector dv/dt, a decreasing gate resistance Rg is selectively used to increase the drain/collector dv/dt at turn on for higher load currents, while a decreasing Rg is selectively used to increase the drain/collector dv/dt at turn off for decreasing load currents.

Figure 6:
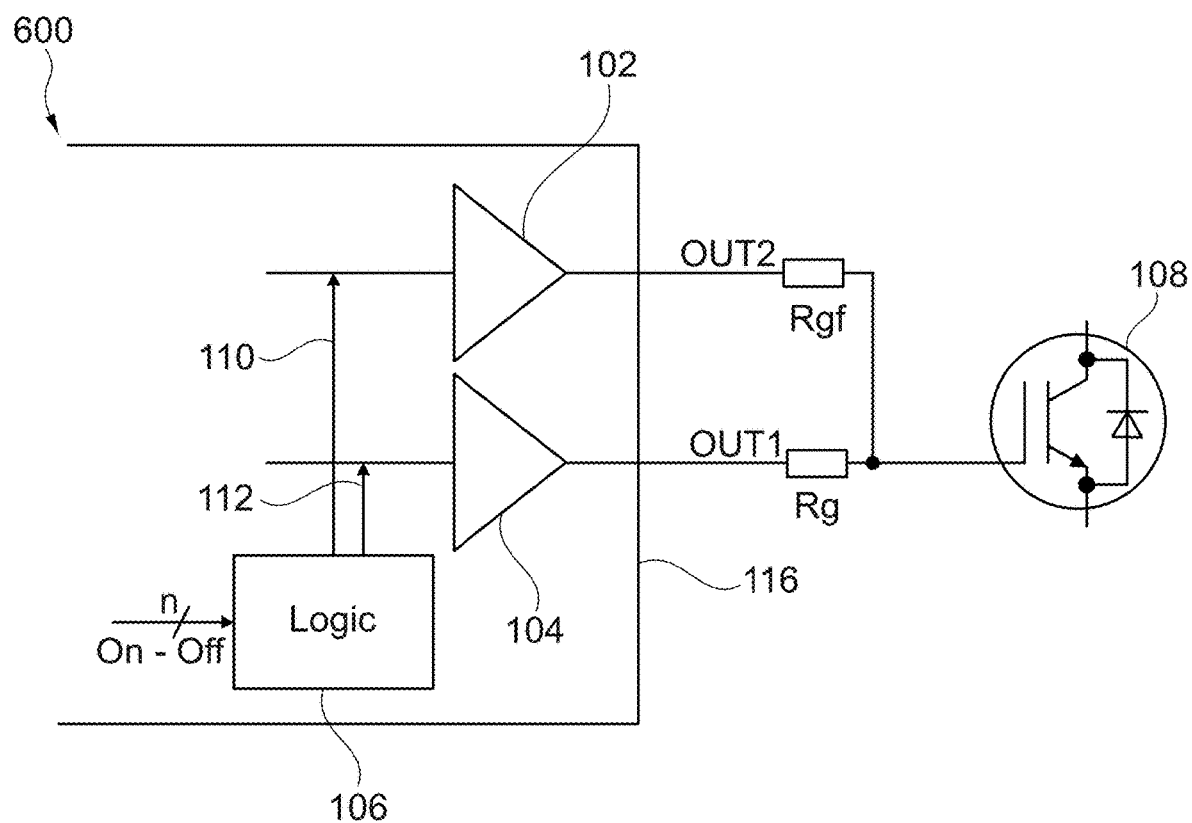
FIG. 6 is a schematic diagram of an embodiment multi-output gate driver system including a multi-output gate driver Integrated Circuit ("IC") with two outputs that can each sink and source current.

FIG. 6 shows the schematic diagram 600 of a multi-output gate driver system 600 comprising a power device 108 having a gate node; a first driver 104 having an input and an output OUT1 coupled to the gate node; a second driver 102 having an input and an output OUT2 coupled to the gate node; and a logic circuit 106 having an input for receiving a control signal (On-Off), a first output 112 coupled to the input of the first driver 104, and a second output no coupled to the input of the second driver 102.

By setting a gate resistance Rgf*<Rg, wherein Rgf*=Rg∥Rgf, at a high drain/collector current, the drain/collector dv/dt can be set to values very close to those obtained with a gate resistance Rg at a low drain/collector current maintaining low switching losses throughout the load range with maintained dv/dt levels for EMI reasons.

This can be realized by activating a second gate drive channel so that the effective gate resistance is Rgf*=Rg∥Rgf as implemented by gate driver system 600 shown in FIG. 6. However, only enabling the output OUT2 for high drain/collector current, always sets a lower effective gate resistance for both turn-on and turn-off of the power transistor 108. Particularly, at turn-off, the activation of the second gate drive channel OUT2 at high collector currents would yield an even higher and therefore undesired drain/collector dv/dt. At high load currents, a lower gate resistance is beneficial for increasing the maximum value of dv/dt at the drain/collector only during the turn-on of the power transistor 108.

Hence, control strategies where the second output OUT2 is activated during high collector current operation for both turn on and off phases cannot be effectively used.

Figure 8:
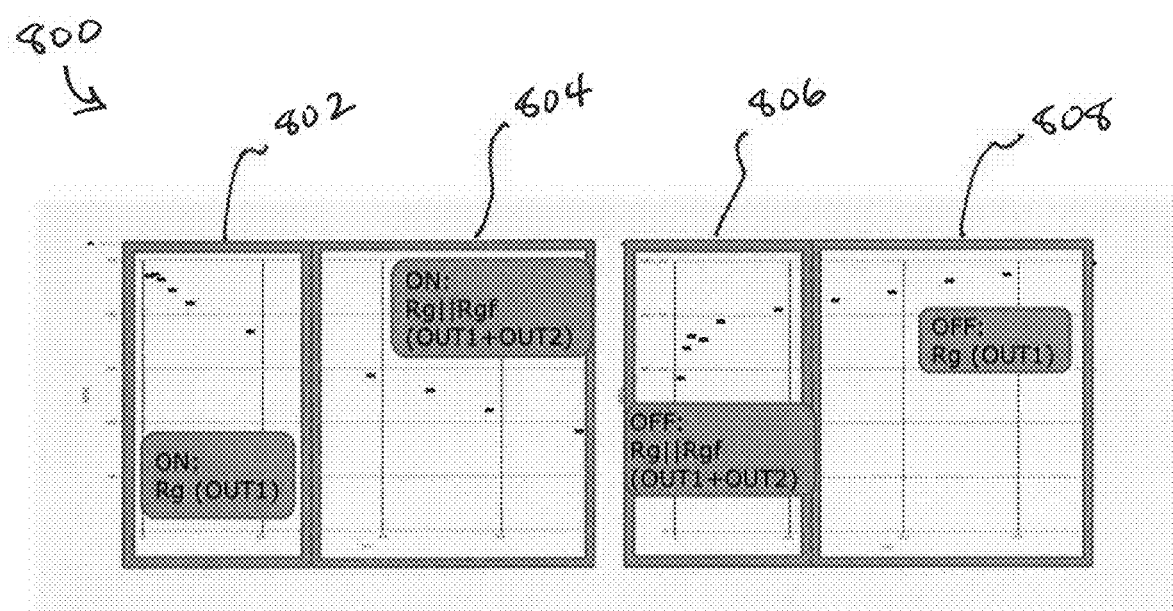
FIG. 8 is a diagram of a control scheme for use with a multi-output gate driver IC, for driving a power device at a specified dv/dt target value, according to an embodiment.

To obtain the maximum benefit in limiting the drain/collector dv/dt, turn-on and turn-off phases are decoupled and oppositely handled, according to embodiments, with lower gate resistance for turn on and higher gate resistance for turn off. The low dv/dt and high dv/dt modes of operation are addressed and explained in further detail below with respect to FIG. 8, for example.

Figure 7:
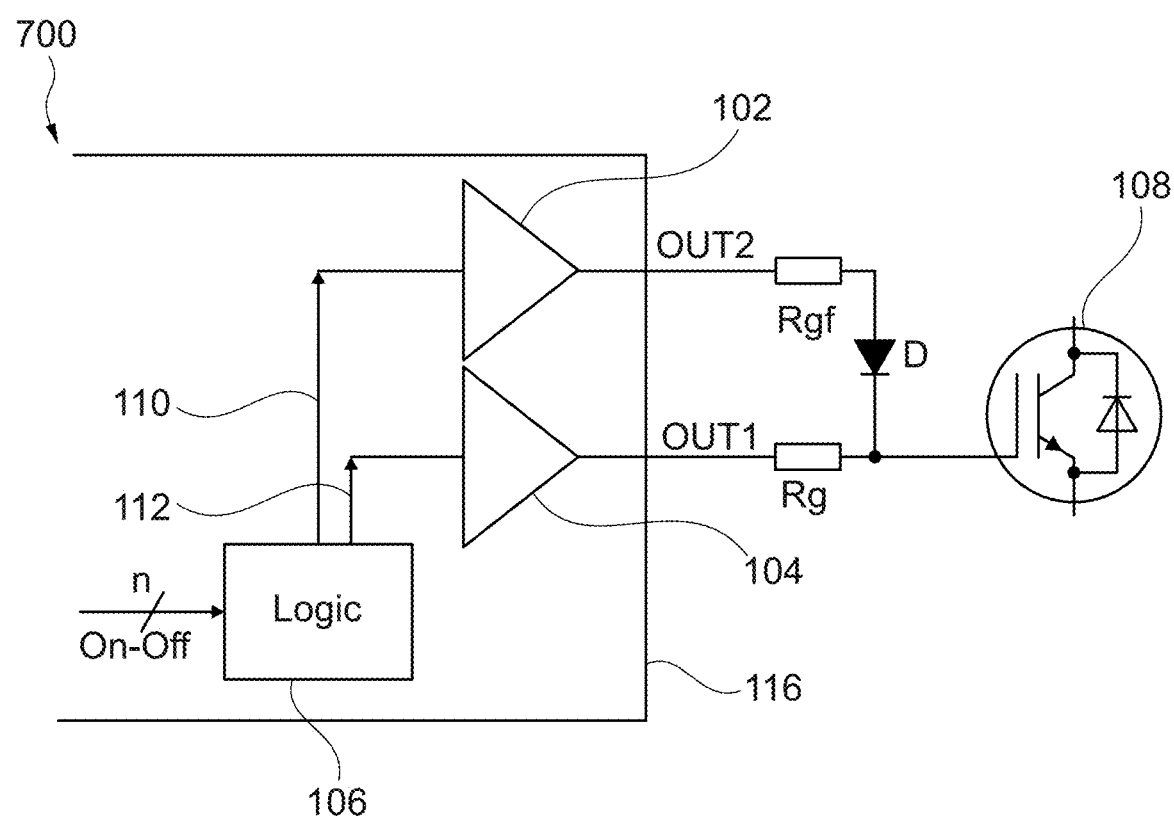
FIG. 7 is a schematic diagram of an embodiment multi-output gate driver system similar to the one shown in FIG. 6, but including a series diode for causing the deactivation of the second output during turn-off conditions.

FIG. 7 shows a schematic diagram 700 of an alternative embodiment of a multi-output gate driver system wherein a diode D is in series connection with the second gate resistor Rgf. The embodiment is the same as shown in FIG. 6, except for the addition of diode D. All of the other components shown in FIG. 7 have been previously identified and described above with respect to FIG. 6.

Thus, the deactivation of the second output's OUT2 sinking capability during high drain/collector current operation can be realized by adding a series diode D to the gate resistor Rgf as is shown in FIG. 7. The inclusion of diode D inhibits a current flow into terminal OUT2 during turn-off, but still allows a current during turn-on.

In still further embodiments each driver 102 and 104 can be independently controlled. Complete independent control, however, results in a more complex overall system solution.

According to embodiments a control scheme in the gate driver IC itself for the outputs OUT1 and OUT2 is based on the input control signals. The control scheme for maintaining a constant dv/dt follows the rules given in diagram 800 of FIG. 8. During a first turn-on mode 802 only a single gate resistor and driver is desired. During a second turn-on mode 804 both gate resistors and drivers are desired. Conversely, during a first turn-off mode 806 both gate resistors and drivers are desired. During a second turn-off mode 808 only a single gate resistor and driver is desired.

The technical implementation for the logic circuit 106 is a simple logic which activates the outputs OUT1 and/or OUT2 based on two control signals (IN and INF). Logic circuit 106 can be implemented with hardware logic gates, or in software as desired. An example logic table for the relationship of the inputs to the outputs of logic circuit 106 is shown in table 900 of FIG. 9. Additionally, the output impedance and operational state for the circuit embodiment of FIG. 6 is also shown.

During a first logic state both IN and INF inputs are low, and the outputs OUT1 and OUT2 are also low. It should be noted that the asterisk indicates an optional logic state for OUT2, and the OUT2 output can be left in HiZ (high impedance state) if desired. This optional logic state for OUT2 pertains to logic states 1, 3, 4, 6, 7, 8, 10, and 11 shown in table 900. The output impedance of OUT1 and OUT2 is OFF.

During a second logic state the IN input transitions from low to high, INF is low, OUT1 transitions from low to high, and the OUT2 output transitions from low to HiZ. The output impedance of OUT1 is Rg and the output impedance of OUT2 is HiZ.

During a third logic state the IN input is low, the INF input transitions from low to high, and outputs OUT1 and OUT2 return to a logic low state. The output impedance of OUT1 and OUT2 is OFF.

During a fourth logic state the IN input is high and the INF input is low. The outputs OUT1 and OUT2 are both high, although OUT2 can be left in a high impedance state as was pointed out above. The output impedance of OUT1 and OUT2 is ON.

During a fifth logic state the IN input transitions from a logic high to a logic low, and INF is low. Outputs OUT1 and OUT2 both transition from logic high to logic low. The output impedance of OUT1 and OUT2 is the parallel combination of Rg and Rgf.

During a sixth logic state the IN input is high and the INF input transitions from a logic low to a logic high. Outputs OUT1 and OUT2 are both high. The output impedance of OUT1 and OUT2 is ON.

During a seventh logic state the IN input is low and the INF input is high. The OUT1 output is low and the OUT2 output is low or in a high impedance state. The output impedance of OUT1 and OUT2 is OFF. The output impedance of OUT1 and OUT2 is OFF.

During an eighth logic state the IN input is low and the INF input transitions from a logic high to a logic low. The OUT1 output is low and the OUT2 output is low or in a high impedance state. The output impedance of OUT1 and OUT2 is OFF.

During a ninth logic state the IN input transitions from a logic low to a logic high and the INF input is high. The outputs OUT1 and OUT2 both transition from a logic low to a logic high. The output impedance of OUT1 and OUT2 is the combination of Rg and Rgf.

During a tenth logic state all inputs and outputs are at a logic high. Alternatively, the OUT2 output can be maintained in a high impedance state. The output impedance of OUT1 and OUT2 is ON.

During an eleventh logic state the IN input is high and the INF input transitions from a logic high to a logic low. Both outputs OUT1 and OUT2 are at a logic high. Alternatively, the OUT2 output can be maintained in a high impedance state. The output impedance of OUT1 and OUT2 is ON.

During a twelfth logic state the IN input transitions from a logic high to a logic low and the INF input is at a logic high. The OUT1 output transitions from a logic high to a logic low and the OUT2 output transitions from a logic high to a high impedance state. The output impedance of OUT1 is OFF and the output impedance of OUT2 is in the high impedance state.

Figure 10:
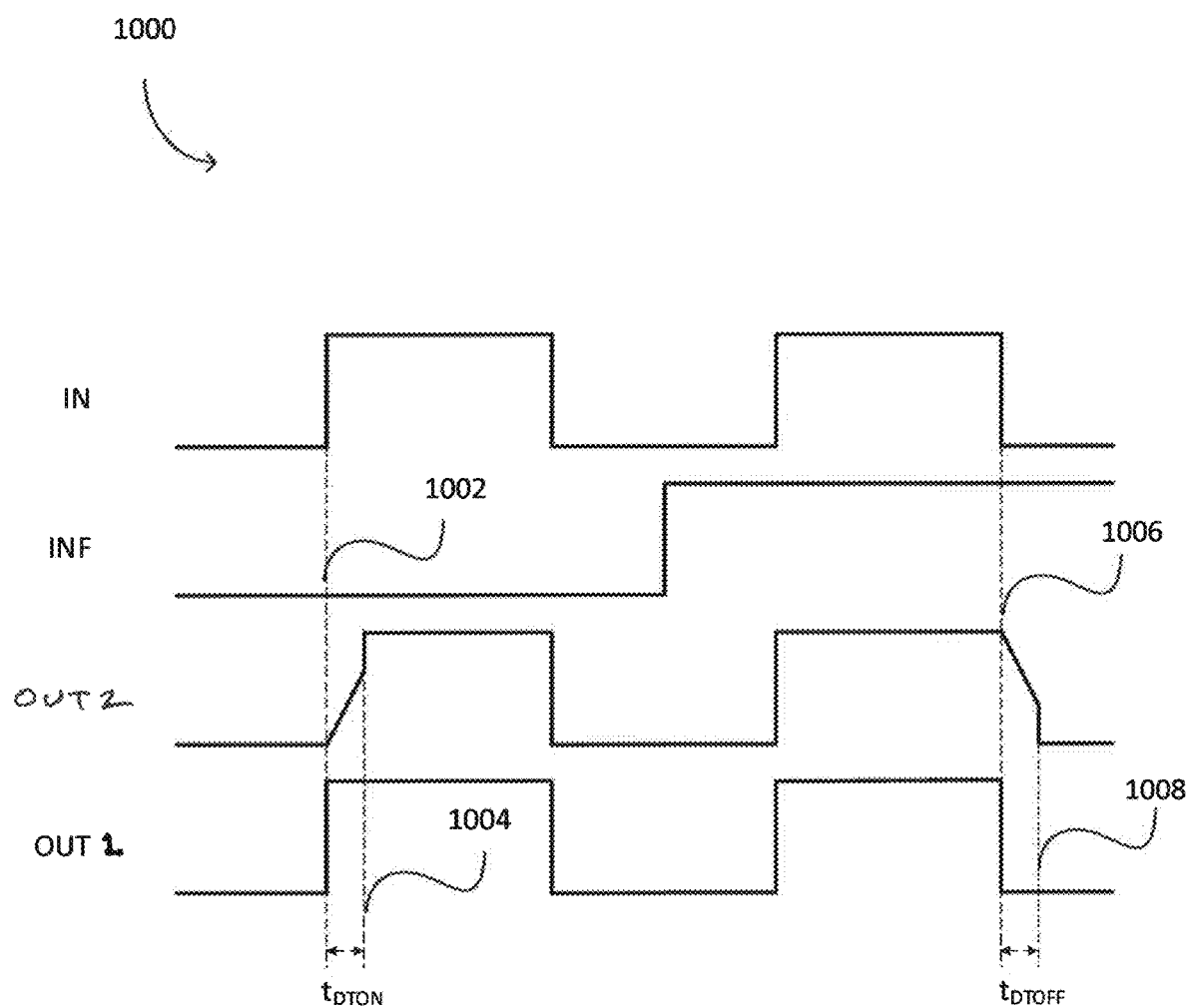
FIG. 10 is a timing diagram corresponding to the table shown in FIG. 9.

FIG. 10 is a timing diagram 1000 corresponding to Table 1 shown in FIG. 9. Individual signal waveforms are shown corresponding to the IN, INF, OUT1, and OUT2 nodes. The rising edge of the IN waveform occurs at time 1002, and the rising edge of the INF waveform is completely switched at time 1004. The falling edge of the IN waveform occurs at time 1006 and the falling edge of the OUT2 waveform is completely switched at time 1008. During time intervals $t_{DTON}$ and $t_{DTOFF}$ output OUT2 is kept in tristate (HiZ or high impedance state). During these time intervals the voltage at OUT2 follows that at the gate of the power switches driven by output OUT1. When OUT2 is switched according to OUT1, then the rising or falling edge is made faster. This switching behavior results in the "sloped" features of the OUT2 waveform shown in FIG. 10.

Figure 11:
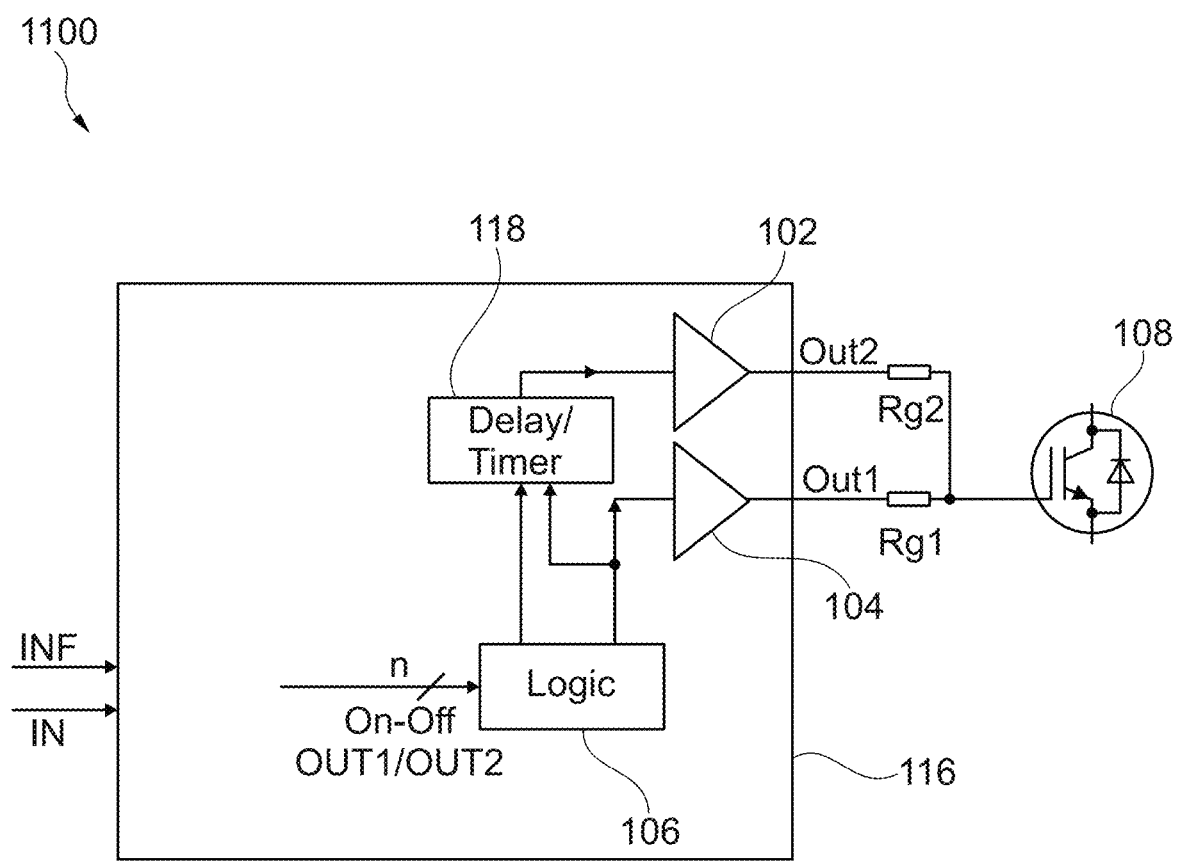
FIG. 11 is a schematic diagram of a multi-output gate driver system, in which the second output of the gate driver IC can be switched using predetermined or programmable delays or switched concurrently with respect to the first output, depending on the logic conditions applied at the inputs.

The time delays tDTON, tDTOFF can be either predetermined or programmed in the logic, as shown in FIG. 11, or could depend on particular voltage levels to be reached at the gate of the power switch, which can be detected by threshold comparators, as shown in FIGS. 1-3 or FIG. 12.

For example, in FIG. 11 a schematic diagram 1100 of an alternative embodiment of a multi-output gate driver system includes a delay/time circuit 118 having first and second inputs coupled to the logic circuit 106, and an output coupled to the second driver 102. Otherwise, the schematic shown in FIG. 11 is substantially the same as shown in FIG. 6 and previously described.

Figure 12:
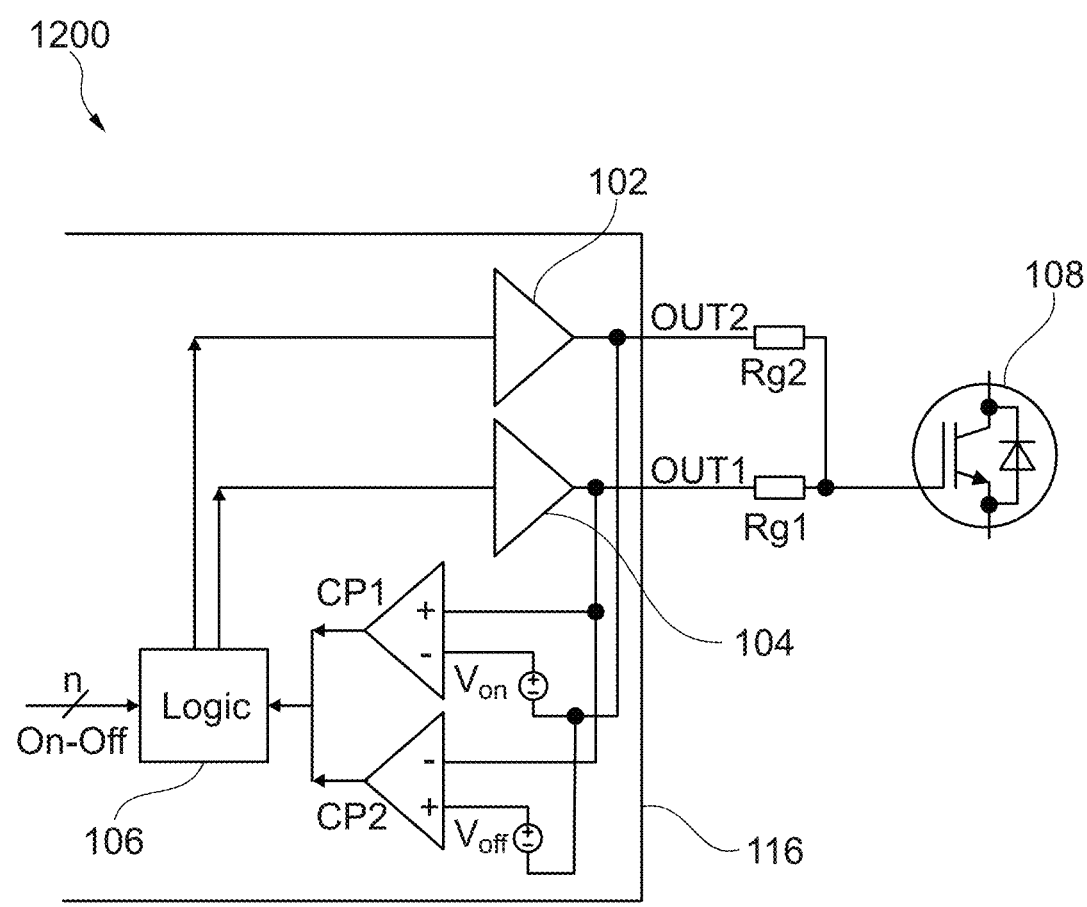
FIG. 12 is a schematic diagram of a multi-output gate driver system, in which the second output of the gate driver IC can be operated using comparators for detecting the voltage levels of the gate of the power device.

As another example, in FIG. 12 a schematic diagram 1200 of an alternative embodiment of a multi-output gate driver system includes first and second comparators CP1 and CP2 each including input and/or output filters. A positive input of comparator CP1 is coupled to the output of the first driver 104, a negative input of comparator CP1 is coupled to the output of the second driver 102 through threshold voltage $V_{ON}$, and an output of comparator CP1 is coupled to an input of logic circuit 106. A negative input of comparator CP2 is coupled to the output of the first driver 104, a positive input of comparator CP2 is coupled to the output of the second driver 102 through threshold voltage $V_{OFF}$, and an output of comparator CP1 is coupled to an input of logic circuit 106.

Otherwise, the schematic shown in FIG. 12 is substantially the same as shown in FIG. 6 and previously described.

Figure 13:
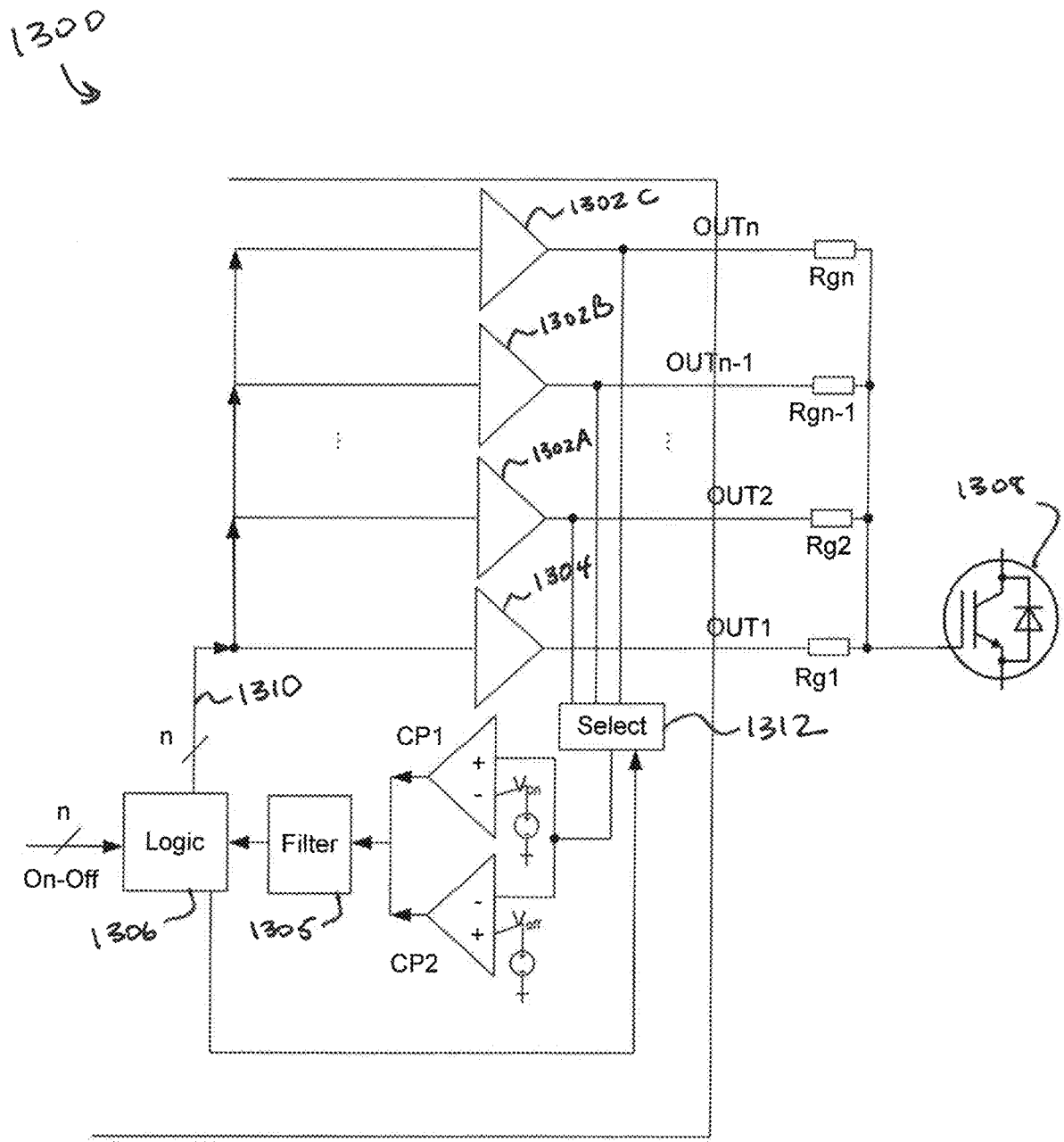
FIG. 13 is a schematic diagram of a multi-output gate driver system in which more than two drivers are shown, wherein each driver has a single output.

FIG. 13 shows an embodiment multi-output gate driver system 1300 in which more than two drivers are explicitly shown. For example, drivers 1304, 1302A, 1302B, and 1302C are shown respectively coupled through outputs OUT1, OUT2, OUTn–1, and OUTn to gate resistors Rg1, Rg2, Rgn–1, and Rgn. The gate resistors are coupled in turn to the gate node of power device 1308. A select circuit 1312 under control of logic circuit 1306 selects one of the driver outputs to be coupled to the inputs of comparators CP1 and CP2. The outputs of comparators CP1 and CP2 are coupled to the input of the logic circuit 1306 through low pass filter 1305. The logic circuit 1306 receives an "n" bit On-Off signal. The operation of multi-output gate driver system 1300 is similar to the embodiments described with respect to FIGS. 1-3 except for the operation of the select circuit and the explicit presence of more than two drivers.

FIG. 14 shows another embodiment multi-output gate driver system 1400 in which more than two drivers are explicitly shown. For example, drivers 1404, 1402A, 1402B, and 1402C are shown respectively coupled through outputs OUT_ON1, OUT_OFF1, OUT_ON2, OUT_OFF2, OUT_ONn–1, OUT_OFFn–1, OUT_ONn, and OUT_OFFn to gate resistors Rgon1, Rgoff1, Rgon2, RGoff2, Rgon_n–1, Rgoff_n–1, and Rgon_n. The gate resistors are coupled in turn to the gate node of power device 1408. A select circuit 1412 under control of logic circuit 1406 selects one of the driver outputs to be coupled to the inputs of comparators CP1 and CP2. The outputs of comparators CP1 and CP2 are coupled to the input of the logic circuit 1406 through low pass filter 1405. The logic circuit 1406 receives an "n" bit On-Off signal. The operation of multi-output gate driver system 1400 is similar to the embodiments described with respect to FIGS. 1-3 except for the operation of the select circuit 1412 and the explicit presence of more than two drivers.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A multi-output gate driver system comprising:
   a power device having a gate node;
   a first driver having an input and an output coupled to the gate node for actively switching the power device on and off;
   a second driver having an input and an output coupled to the gate node;
   a first comparator having a first input coupled to the output of the second driver, a second input coupled to a first reference voltage, and an output;
   a second comparator having a first input coupled to the output of the second driver, a second input coupled to a second reference voltage, and an output; and
   a logic circuit having a first input for receiving a control signal for switching the power device on and off, a second input coupled to the outputs of the first and second comparators, a first output coupled to the input of the first driver, and a second output coupled to the input of the second driver,
   wherein a signal on the second input of the logic circuit indicates whether the output of the second driver reaches or exceeds the first reference voltage or whether the output of the second driver reaches or falls below the second reference voltage, wherein the output of the second driver is configured to be correspondingly clamped to either a positive voltage rail or a negative voltage rail in response to a signal on the second output of the logic circuit, and wherein the second driver is selectively configured to be in a high impedance state depending upon a logic state of the logic circuit.

2. The multi-output gate driver system of claim 1, wherein the second driver is configured to be clamped during both a turn-on mode of operation and a turn-off mode of operation.

3. The multi-output gate driver system of claim 1, wherein the second driver is configured to be clamped during a turn-on mode of operation and configured to actively switch during a turn-off mode of operation.

4. The multi-output gate driver system of claim 1, wherein the second driver is configured to be clamped during a turn-off mode of operation and configured to actively switch during a turn-on mode of operation.

5. The multi-output gate driver system of claim 1, wherein the second driver is configured to be clamped or actively switched in response to an additional control signal received by the logic circuit.

6. The multi-output gate driver system of claim 1, wherein the first and second comparators comprise at least one of an input filter or an output filter.

7. The multi-output gate driver system of claim 1, further comprising a first gate resistor coupled between the output of the first driver and the gate node of the power device.

8. The multi-output gate driver system of claim 7, further comprising a second gate resistor coupled between the output of the second driver and the gate node of the power device.

9. A method for operating a multi-output gate driver system including first and second gate drivers each including an output coupled to a power device, the method comprising:
   turning on the power device with the first gate driver output, sensing a voltage of the second gate driver output to determine that the voltage at the second gate driver output is greater than a first reference voltage, and clamping the voltage of the second gate driver output to a first clamping voltage in a first mode of operation;
   turning off the power device with the first gate driver output, sensing the voltage of the second gate driver output to determine that the voltage at the second gate driver output is less than a second reference voltage, and clamping the voltage of the second gate driver output to a second clamping voltage in a second mode of operation;
   sensing the second gate driver output with first and second comparators in the first mode of operation;
   sensing the second gate driver output with first and second comparators in the second mode of operation; and
   selectively placing the second driver in a high impedance state depending upon a logic state of the first and second comparators, and a logic state of an input signal of the multi-output gate driver system.

10. The method of claim 9, wherein the second gate driver is delayed with respect to the first gate driver in the first mode of operation.

11. The method of claim 9, wherein the second gate driver is delayed with respect to the first gate driver in the second mode of operation.

12. The method of claim 9, further comprising coupling at least one of a first gate resistor between the first gate driver and the power device, and a second gate resistor between the second gate driver and the power device.

13. A method of operating a multi-output gate driver system comprising a power device having a gate node, the method comprising:
- actively switching the power device on and off with a first driver coupled to the gate node;
- selectively driving the gate node with a second driver;
- comparing an output of the second driver to a first reference voltage to generate a first logic signal;
- comparing the output of the second driver to a second reference voltage to generate a second logic signal;
- logically combining a control signal of the multi-output gate driver system, the first logic signal, and the second logic signal to generate an output logic signal;
- clamping the output of the second driver to either a positive voltage rail or a negative voltage rail in response to the output logic signal; and
- selectively placing the second driver in a high impedance state in response to the output logic signal.

14. The method of claim 13, wherein the second driver is clamped during both a turn-on mode of operation and a turn-off mode of operation.

15. The method of claim 13, wherein the second driver is clamped during a turn-on mode of operation and actively switched during a turn-off mode of operation.

16. The method of claim 13, wherein the second driver is clamped during a turn-off mode of operation and actively switched during a turn-on mode of operation.

17. The method of claim 13, wherein the second driver is clamped or actively switched in response to logically combining an additional control signal with the control signal of the multi-output gate driver system, the first logic signal, and the second logic signal to generate the output logic signal.

18. The method of claim 13, further comprising filtering the first and second logic signals.

19. The method of claim 13, further comprising coupling a first gate resistor between the output of the first driver and the gate node of the power device.

20. The method of claim 19, further comprising coupling a second gate resistor between the output of the second driver and the gate node of the power device.

* * * * *